United States Patent [19]
Jeong

[11] Patent Number: 6,154,415
[45] Date of Patent: Nov. 28, 2000

[54] INTERNAL CLOCK GENERATION CIRCUIT OF SEMICONDUCTOR DEVICE AND METHOD FOR GENERATING INTERNAL CLOCK

[75] Inventor: Woo-seop Jeong, Suwon, Rep. of Korea

[73] Assignee: Samsung Electronics, Co., Ltd., Suwon, Rep. of Korea

[21] Appl. No.: 09/024,572

[22] Filed: Feb. 17, 1998

[30] Foreign Application Priority Data

Feb. 17, 1997 [KR] Rep. of Korea .......................... 97-4778

[51] Int. Cl.[7] .................................................. G11C 8/00
[52] U.S. Cl. .................. 365/233; 365/189.05; 365/233.5
[58] Field of Search .............................. 365/233, 189.05, 365/233.5

[56] References Cited

U.S. PATENT DOCUMENTS

| | | | |
|---|---|---|---|
| 5,301,165 | 4/1994 | Ciraula et al. | 365/233.5 |
| 5,748,553 | 5/1998 | Kitamura | 365/230.03 |
| 5,808,961 | 9/1998 | Sawada | 365/233 |
| 5,880,998 | 3/1999 | Tanimura et al. | 365/189.05 |
| 5,898,331 | 4/1999 | Fujita | 327/296 |

*Primary Examiner*—Richard Elms
*Assistant Examiner*—Tuan T. Nguyen
*Attorney, Agent, or Firm*—Marger Johnson & McCollom, P.C.

[57] ABSTRACT

An internal clock generation circuit for a semiconductor device and a method for generating an internal clock signal are disclosed. The internal clock generation circuit reduces the power consumed by a semiconductor device by generating internal clock pulses only when they are necessary for the operation of the device. The internal clock generation circuit includes a clock buffer, an internal clock generation unit, a chip selection buffer and an internal clock control unit. The clock buffer converts the voltage level of an external clock signal. The internal clock generation unit receives the output from the clock buffer and generates an internal clock signal only when a control signal is enabled. The chip selection buffer converts the voltage level of a chip selection signal which is active when the device is enabled. The internal clock control unit receives the output from the chip selection buffer and generates the control signal which is activated when the chip selection signal is active. The internal clock control unit also activates the control signal when either a column address signal or a latency signal is enabled. The internal clock signal is disabled when the control signal is disabled, and enabled when the control signal is enabled and at the same time the external clock signal is enabled.

21 Claims, 4 Drawing Sheets

INTERNAL CLOCK GENERATION CIRCUIT OF SEMICONDUCTOR DEVICE AND METHOD FOR GENERATING INTERNAL CLOCK

This application corresponds to Korean patent application No. 97-4778 filed Feb. 17, 1997 in the name of Samsung Electronics Co., Ltd.

BACKGROUND OF THE INVENTION

1. Field of the Invention

The present invention relates to semiconductor devices, and more particularly, to a method and apparatus for generating an internal clock signal for a semiconductor device.

2. Description of the Related Art

In a synchronous DRAM semiconductor memory device, each of the internal devices are controlled by an internal clock signal which has the same period as an external clock signal which is applied to the device. An internal clock generation circuit generates the internal clock signal in response to the external clock signal.

FIG. 1 is a block diagram of a conventional internal clock generation circuit for a synchronous DRAM semiconductor device. Referring to FIG. 1, the internal clock generation circuit includes a clock buffer 13 for receiving an external clock signal CLK, and an internal clock generation unit 15 for receiving the output of the clock buffer 13 to generate an internal clock signal PCLK.

The external clock signal is applied as a transistor-transistor logic (TTL) level signal. Since all signals of the synchronous DRAM semiconductor device 11 operate at a CMOS level, the clock buffer 13 converts the TTL level external clock signal into a CMOS level signal. The internal clock generation unit 15 generates the internal clock signal PCLK in response to the external clock signal which has been converted to a CMOS level.

FIG. 2 is a circuit diagram of the internal clock generation unit 15 shown in FIG. 1. Referring to FIG. 2, the internal clock generation unit 15 has first through fifth inverters 21, 22, 23, 24 and 25 which are connected in series with the output of the clock buffer 13 of FIG. 1, and delays the output of the clock buffer 13 by a predetermined time. The phase of output of the clock buffer 13 is inverted while passing through the fifth inverter 25. The output of the fifth inverter 25 and the output of the clock buffer 13 are input into a first NAND gate 27. The output of the first NAND gate 27 is logic low level only when all of the received signals are at a logic high level. The output of the first NAND gate 27 is connected to sixth through eighth inverters 29, 30 and 31, which stabilize the signal generated by the first NAND gate 27. The output of the first NAND gate 27 is inverted by the eighth inverter 31. The internal clock signal PCLK is generated by the eighth inverter 31.

FIG. 3 is a circuit diagram of the clock buffer 13 of FIG. 1. The clock buffer 13 includes a differential amplifier 33 which receives the external clock signal CLK and a reference voltage VREF of 1.4 volts. The differential amplifier 33 includes a first PMOS transistor 35 having a source connected to a CMOS level power supply voltage Vdd and a grounded gate, second and third PMOS transistors 37 and 39 connected to the first PMOS transistor 35, and first and second NMOS transistors 41 and 43 connected between the second and third PMOS transistors 37 and 39 the ground voltage GND. The output of the differential amplifier 33 is generated at a node at which the third PMOS transistor 39 is connected to the second NMOS transistor 43.

The differential amplifier 33 outputs the power supply voltage Vdd when the voltage of the external clock signal CLK is higher than the reference voltage VREF, and outputs the ground voltage GND when the voltage of the external clock signal CLK is lower than the reference voltage VREF.

In order to control the differential amplifier 33, the output of the differential amplifier is connected to ninth and tenth inverters 45 and 47, and to a second NAND gate 49. A control signal PCKE is input to the second NAND gate 49. When the control signal PCKE is logic low, the output of the second NAND gate 49 is logic high, and when the control signal PCKE is logic high, the output of the second NAND gate 49 is the same as the output of the tenth inverter 47, but inverted.

FIG. 4 is a timing diagram illustrating the operation of the internal clock generation circuit of FIG. 1. When the CSB signal is enabled to a logic low level, an external command COM is input, thereby activating the synchronous DRAM semiconductor device 11. Even after the CSB signal is disabled to a logic high level, the synchronous DRAM semiconductor device 11 is in an active state. When the CSB signal goes low again, another command which specifies a reading or writing operation is input into the synchronous DRAM semiconductor device 11.

The internal clock generation circuit shown in FIG. 1 generates an internal clock signal PCLK whenever the external clock signal CLK is triggered to a logic high level regardless of the state of the CSB signal and the command COM. However, the synchronous DRAM semiconductor device 11 performs an active operation and read and write operations only when the CSB signal is enabled. Accordingly, only the pulses P0 and P4 pulses of the internal clock signal PCLK shown in FIG. 4 are required. However, all of the pulses P1, P2, P3, P5, P6, P7 and P8 are generated by the conventional internal clock generation circuit, thereby increasing the power consumption of the device. This, in turn, causes many internal portions of the synchronous DRAM semiconductor device which are controlled by the internal clock signal PCLK to operate in response to the unnecessary pulses which further increases power consumption.

SUMMARY OF THE INVENTION

To solve the above problems, it is an object of the present invention to provide an internal clock generation circuit for a semiconductor device which is capable of reducing power consumption.

It is another object of the present invention to provide a method for generating an internal clock of a semiconductor device capable of reducing power consumption.

Accordingly, to achieve the above first object, there is provided an internal clock generation circuit including a clock buffer, an internal clock generation unit, a chip selection buffer and an internal clock control unit.

The clock buffer receives an external clock signal and converts the voltage level of the external clock signal.

The internal clock generation unit receives the output of the clock buffer and is controlled by a control signal to generate an internal clock signal.

The chip selection buffer receives a chip selection signal for activating the semiconductor device and converting the voltage level of the chip selection signal.

The internal clock generation unit receives the output of the chip selection buffer and generates the control signal.

The internal clock signal is disabled when the control signal is disabled, and enabled when both the control signal and the external clock signal are enabled.

To achieve the second object, there is provided a method for generating an internal clock of a semiconductor device to which an external clock signal, a chip selection signal and commands are applied. The method comprises the steps of inputting the commands and enabling the chip selection signal, enabling the external clock signal, and generating a control signal PCLKP and an internal clock signal.

The control signal PCLKP is enabled when the chip selection signal is enabled.

The internal clock signal is enabled when both the control signal PCLKP and the external clock signal are enabled.

The internal clock signal is not generated when the control signal PCLKP is disabled.

An advantage of the present invention is that it reduces the power consumption of the semiconductor device.

DETAILED DESCRIPTION

Figure 1:
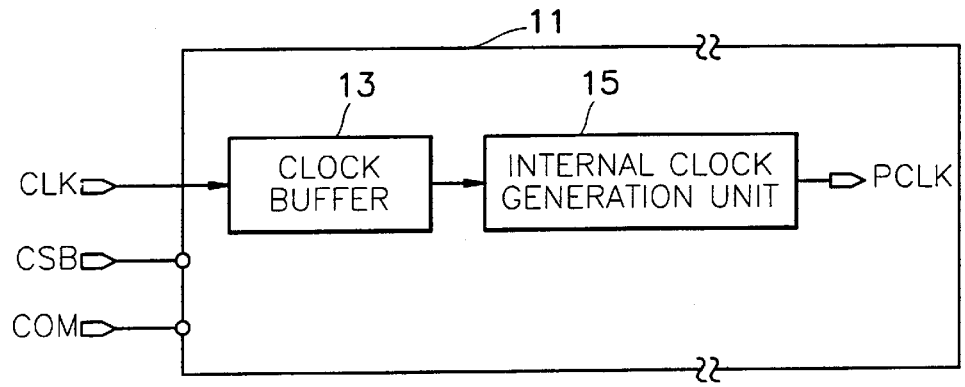
FIG. 1 is a block diagram of a conventional internal clock generation circuit for a synchronous DRAM semiconductor device.
Figure 2:
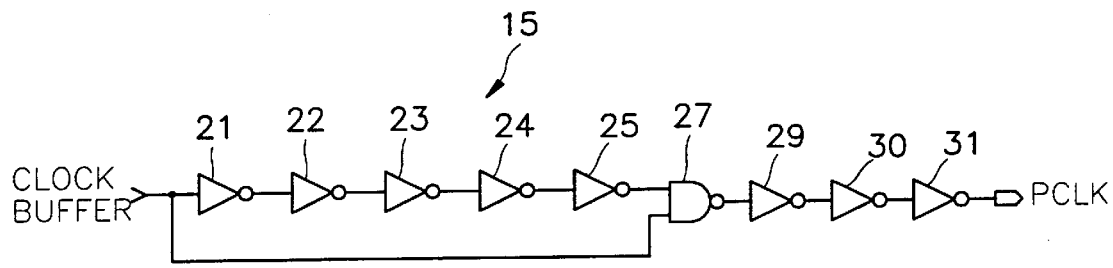
FIG. 2 is a circuit diagram of the internal clock generation unit shown in FIG. 1.
Figure 3:
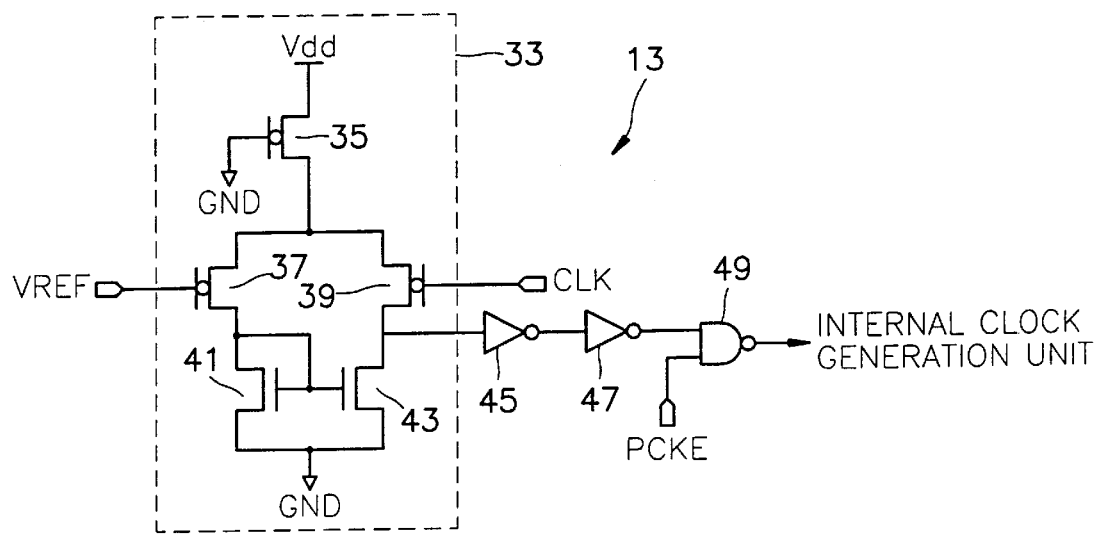
FIG. 3 is a circuit diagram of the clock buffer shown in FIG. 1.
Figure 4:
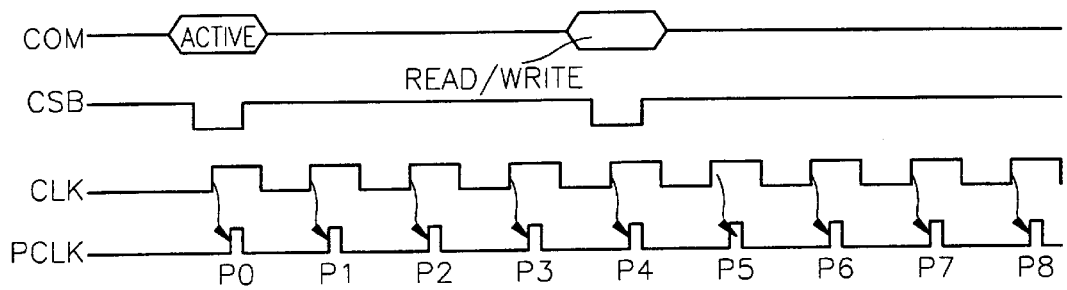
FIG. 4 is a timing diagram illustrating the operation of the internal clock generation circuit of FIG. 1.
Figure 5:
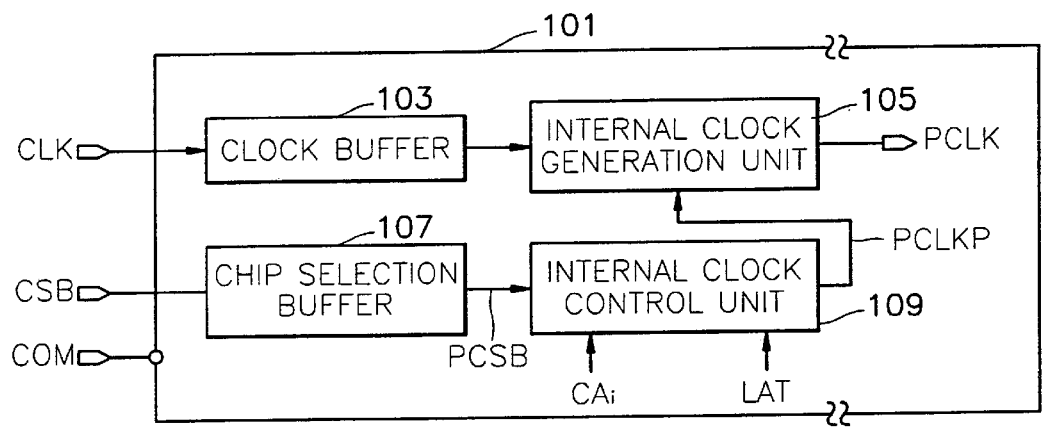
FIG. 5 is a block diagram of an embodiment of an internal clock generation circuit for a synchronous DRAM semiconductor device according to the present invention.

Referring to FIG. 5, an internal clock generation circuit according to the present invention is included in a synchronous DRAM semiconductor device 101. The internal clock generation circuit includes a clock buffer 103 for receiving an external clock signal CLK, an internal clock generation unit 105 for generating an internal clock signal PCLK in response to the output of the clock buffer 103 and a control signal PCLKP, a chip selection buffer 107 for receiving an external chip selection signal CSB, and an internal clock control unit 109 for generating a control signal PCLKP in response to the output signal PCSB from the chip selection buffer 107, a column address signal CAi, and a latency signal LAT which indicates the latency of data read from the device. External commands COM are input to the synchronous DRAM semiconductor device 101.

When the external clock signal CLK is running, the semiconductor device 101 begins operating when the chip selection signal CSB is enabled. That is, the semiconductor device 101 begins operating when an external command, for example, a row address strobe signal RAS or a read/write command is input when the chip selection signal CSB, which is referenced to the external clock signal CLK, is enabled. The chip selection signal CSB is enabled for a setup time $t_{SS}$ and held for a hold time $t_{SH}$ with respect to the external clock signal CLK. The chip selection buffer 107 operates during the setup and hold times such that the setup and hold times of the chip selection signal CSB, which is received as a TTL level signal by the semiconductor device 101, can be secured with respect to the external clock signal CLK.

The synchronous DRAM semiconductor device 101 operates in response to the command COM when the chip selection signal CSB is enabled to logic low, and does not operate at all when the chip selection signal CSB is disabled to logic high.

Internal clock generation unit 105 generates the internal clock signal PCLK when the external clock signal CLK is input to the device. The internal clock signal PCLK controls the operation of all of the buffers (not shown) in the semiconductor device 101. The internal buffers are activated when PCLK is enabled to logic high, and deactivated when PCLK is disabled to logic low.

Figure 6:
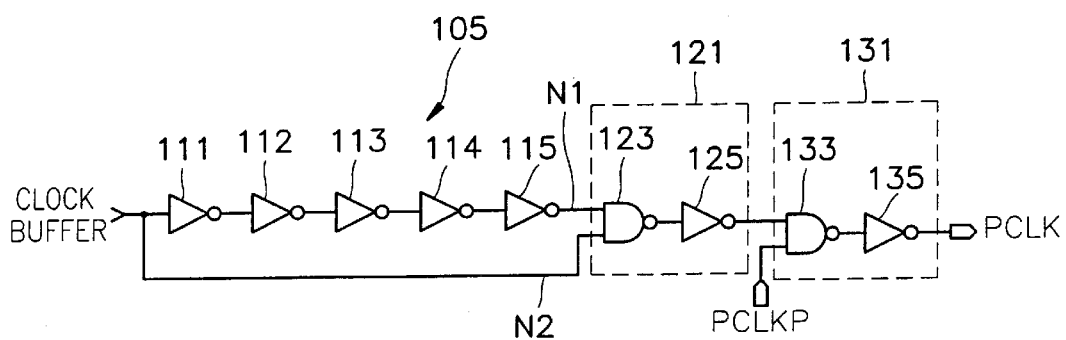
FIG. 6 is a circuit diagram of an embodiment of the internal clock generation unit shown in FIG. 5.

FIG. 6 is a circuit diagram of an embodiment of the internal clock generation unit 105 shown in FIG. 5. The internal clock generation unit 105 includes first through fifth inverters 111, 112, 113, 114 and 115 which are connected in series with the output of the clock buffer 103, a first logic gate 121 for receiving the output of the fifth inverter 115 and the output of the clock buffer 103 of FIG. 5, and a second logic gate 131 for receiving the output of the first logic gate 121 and the control signal PCLKP. The output of the first logic gate 121 is a logic high level only when the output of the fifth inverter 115 and the output of the clock buffer 103 of FIG. 5 are logic high. The second logic gate 131 generates the internal clock signal PCLK which is a logic high only when the output of the first logic gate 121 and the control signal PCLKP are logic high.

The output from the clock buffer 103 of FIG. 5 is inverted and delayed for a predetermined time by the first through fifth inverters 111, 112, 113, 114, and 115. The first logic gate 121 includes a first NAND gate 123, which receives the output from the fifth inverter 115 and the output from the clock buffer 103, and a sixth inverter 125 which inverts the output of the first NAND gate 123. The second logic gate 131 includes a second NAND gate 133, which receives the output from the sixth inverter 125 and the control signal PCLKP, and a seventh inverter 135 which inverts the output of the second NAND gate 133 to generate the internal clock signal PCLK.

Figure 7:
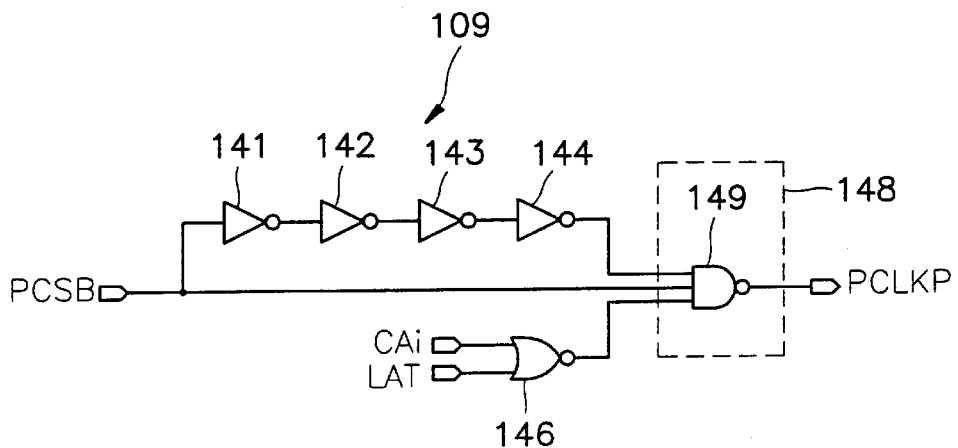
FIG. 7 is a circuit diagram of an embodiment of the internal clock controller shown in FIG. 5.

FIG. 7 is a circuit diagram of an embodiment of the internal clock control unit 109 shown in FIG. 5. Referring to FIG. 7, the internal clock control unit 109 includes eighth through eleventh inverters 141, 142, 143 and 144 connected in series with the output of the chip selection buffer 107 of FIG. 5, a NOR gate 146 for receiving a column address signal CAi and a latency signal LAT, and a third logic gate 148 for receiving the output of the NOR gate 146, the output of the eleventh inverter 144 and an output signal PCSB of the chip selection buffer 107 of FIG. 5 to generate a control signal PCLKP.

The third logic gate 148 is composed of a three-input NAND gate 149. When any one of the outputs from the NOR gate 146, the eleventh inverter 144, or the signal PCSB from the chip selection buffer 107 of FIG. 5 is logic low, the control signal PCLKP is logic high, and when all of the outputs from the NOR gate 146, the eleventh inverter 144 and the signal PCSB from the chip selection buffer 107 of FIG. 5 are logic high, the control signal PCLKP is logic low.

The output signal PCSB from the chip selection buffer 107 of FIG. 5 is delayed by a predetermined time while passing through the eighth through eleventh inverters 141, 142, 143, and 144. This prevents the internal clock signal PCLK from being disabled immediately after the chip selection signal CSB is disabled as described below with respect to FIG. 10. Also, when either the column address signal CAi or the latency signal LAT is high, the control signal PCLKP is enabled.

Figure 8:
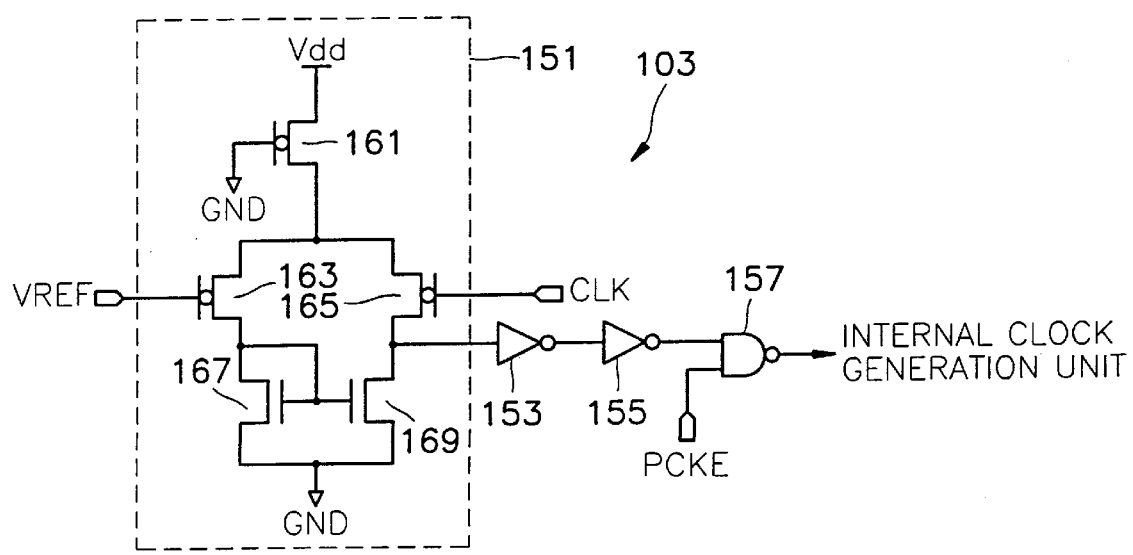
FIG. 8 is a circuit diagram of an embodiment of the clock buffer shown in FIG. 5.

FIG. 8 is a circuit diagram of an embodiment of the clock buffer 103 shown in FIG. 5. Referring to FIG. 8, the clock buffer 103 includes a first differential amplifier 151 for receiving the external clock signal CLK and a reference voltage VREF, for example, a voltage of 1.4V, twelfth and thirteenth inverters 153 and 155 connected in series with the output of the first differential amplifier 151, and a fourth NAND gate 157 for receiving the output of the thirteenth inverter 155 and another control signal PCKE.

The first differential amplifier 151 includes a first PMOS transistor 161 having a source connected to a power supply voltage Vdd and a grounded gate, second and third PMOS transistors 163 and 165 connected to the first PMOS transistor 161, and first and second NMOS transistors 167 and 169 connected between the second and third PMOS transistors 163 and 165 and a ground voltage GND. The reference voltage VREF and the external clock signal PCLK are input to gates of the second and third PMOS transistors 163 and 165, respectively.

The drain and a gate of the first NMOS transistor 167 are connected to the gate of the second NMOS transistor 169. The output of the first differential amplifier 151 is generated from a node at which the drain of the third PMOS transistor 165 and the drain of the second NMOS transistor 169 are commonly connected.

Because all of the signals of the synchronous DRAM semiconductor device 101 of FIG. 5 operate at CMOS levels, the clock buffer 103 converts the external clock signal CLK, which is a TTL level signal, to a CMOS level signal. The first differential amplifier 151 outputs a logic high when the external clock signal CLK is lower than the reference voltage Vref, and outputs a logic low when CLK is higher than VREF. Inverters 153 and 155 and NAND gate 157 allow the control signal PCKE to control the output signal from the differential amplifier 151. That is, when the control signal PCKE is enabled to a logic high, the output from the clock buffer 103 is the complement of the output from the first differential amplifier 151. However, when the control signal PCKE is low, the output signal from the clock buffer 103 is always high.

Figure 9:
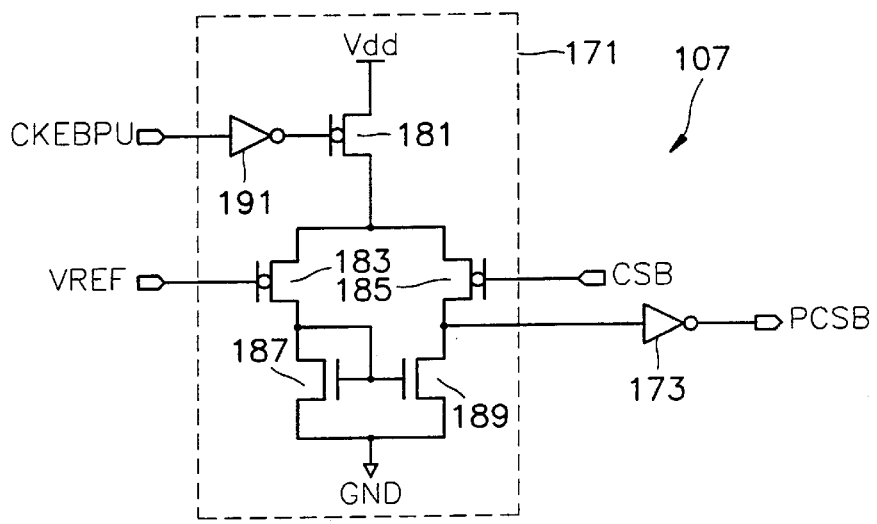
FIG. 9 is a circuit diagram of an embodiment of the chip selection buffer shown in FIG. 5.

FIG. 9 is a circuit diagram of an embodiment of the chip selection buffer 107 of FIG. 5. Referring to FIG. 9, the chip selection buffer 107 includes a second differential amplifier 171 for receiving the chip selection signal CSB and the reference voltage VREF, i.e., a voltage of 1.4V, and a fourteenth inverter 173 for receiving the output of the second differential amplifier 171 to generate a control signal PCSB. The second differential amplifier 171 includes a fourth PMOS transistor 181 having a source connected to a power supply voltage Vdd and a gate connected to a control signal CKEBPU which controls the second differential amplifier. The chip selection buffer also includes fifth and sixth PMOS transistors 183 and 185 which have their sources connected to the drain of the fourth PMOS transistor 181, and third and fourth NMOS transistors 187 and 189 connected between the drains of the fifth and sixth PMOS transistors 183 and 185 and the ground voltage GND, respectively. The reference voltage VREF and the chip selection signal CSB are received by gates of the fifth and sixth PMOS transistors 183 and 185, respectively. The drain and gate of the third NMOS transistor 187 are connected to the gate of the fourth NMOS transistor 189. The output of the second differential amplifier 171 is generated from a node at which the drain of the sixth PMOS transistor 185 and the drain of the fourth NMOS transistor 189 are commonly connected. The output of the second differential amplifier 171 is inverted by the fourteenth inverter 173, and the output signal PCSB of the chip selection buffer 107 is generated from the fourteenth inverter 173.

The chip selection buffer 107 converts the chip selection signal CSB from a TTL level signal to a CMOS level signal. The operation of the second differential amplifier 171 is controlled by a control signal CKEBPU which is applied to the gate of PMOS transistor 181 through inverter 191. Accordingly, when CKEBPU is high, the differential amplifier 171 operates and generates an output signal that is a logic high when the chip selection signal CSB is lower than the reference voltage and logic low when CSB is higher than the reference voltage. When the control signal CKEBPU is low, the differential amplifier 171 is disabled.

Figure 10:
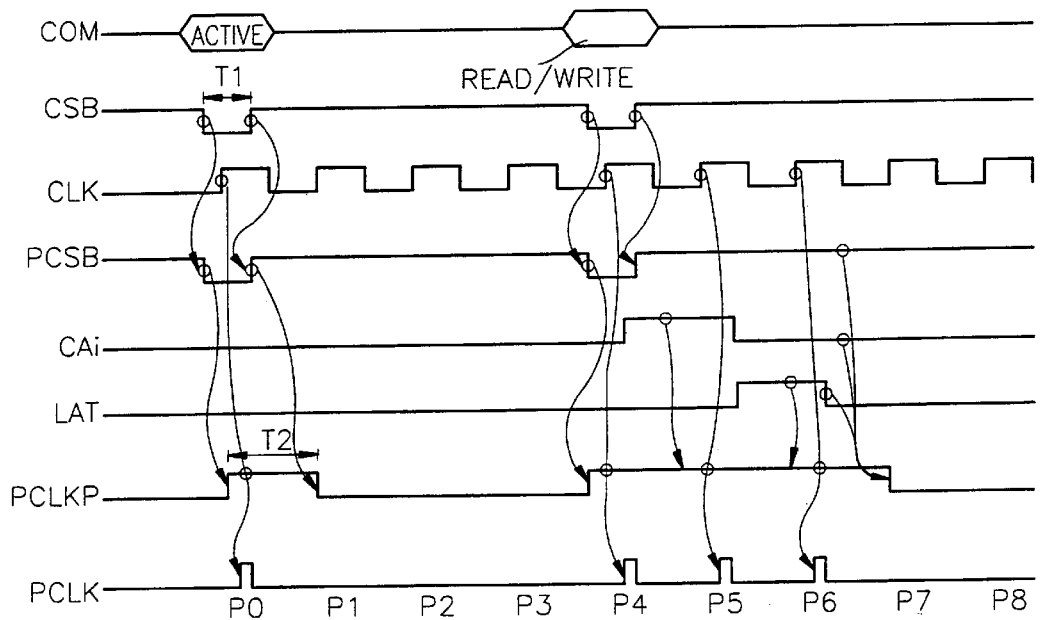
FIG. 10 is a timing diagram illustrating the operation of the internal clock generation circuit shown in FIG. 5.

FIG. 10 is a timing diagram of the signals shown in the internal clock generation circuit of FIG. 5. An operation of the internal clock generation circuit according to the present invention will be described with reference to FIG. 10. Node N1 is the output terminal of the fifth inverter 115 of FIG. 6, and node N2 is the output terminal of the clock buffer 103 of FIG. 5. Since the initial state of the external clock signal CLK is disabled to logic low, the output of the clock buffer 103 of FIG. 5 is logic low. Therefore, node N2 is logic low, and node N1 is at a logic high state in which the output of the clock buffer 103 of FIG. 5 is inverted. Accordingly, the output of the sixth inverter 125 shown in FIG. 6 is logic low. Since the initial state of the chip selection signal CSB is disabled to logic high, the control signal PCSB is logic high. Since the initial states of the column address signal CAi and the latency signal LAT are logic low, the output of the NOR gate 146 of FIG. 7 is logic high. Accordingly, the control signal PCLKP is logic low. Since the control signal PCLKP and the output of the sixth inverter 125 of FIG. 6 are logic low, the output of the second NAND gate 133 of FIG. 6 is logic high. Therefore, the internal clock signal PCLK is disabled to logic low.

In the synchronous DRAM semiconductor device 101 of FIG. 5, the setup time of the CSB signal begins earlier than the external clock signal CLK. Therefore, the chip selection signal CSB is enabled earlier than the external clock signal CLK.

The generation of the clock pulse P0 will now be described with reference to FIG. 10. When the active command is received and the chip selection signal CSB is enabled to logic low, the output signal PCSB of the chip selection buffer 107 of FIG. 5 goes low. Accordingly, the output of the third NAND gate 149 of FIG. 7 goes high. At this time, when the external clock signal CLK is enabled to logic high, the output of the clock buffer 103 of FIG. 5 goes high, thereby causing node N2 to go high. At this time, since node N1 is still at a logic high state, the output of the first NAND gate 123 of FIG. 6 goes low. Accordingly, the output of the sixth inverter 125 of FIG. 6 goes high. When the control signal PCLKP is logic high, the output of the second NAND gate 133 of FIG. 6 is determined by the output of the sixth inverter 125 of FIG. 6. Since the output of the sixth inverter 125 of FIG. 6 is logic high, the output of the second NAND gate 133 of FIG. 6 is logic low. Since the output of the second NAND gate 133 of FIG. 6 is inverted by the seventh inverter 135 of FIG. 6, the internal clock signal PCLK is logic high.

The output of the clock buffer 103 of FIG. 5 is delayed and inverted while passing through the first through fifth inverters 111, 112, 113, 114 and 115 of FIG. 6 before it reaches node N1 of FIG. 6. Accordingly, node N1 switches from logic high to logic low. Therefore, the output of the first NAND gate 123 of FIG. 6 goes high, and then back low after passing through the sixth inverter 125 of FIG. 6. Since the output of the sixth inverter 125 of FIG. 6 is logic low and the control signal PCLKP is logic high, the second NAND gate 133 of FIG. 6 goes high and is inverted by the seventh inverter 135 of FIG. 6. Therefore, the internal clock signal PCLK goes low. Thus, the clock pulse P0 of FIG. 10 is generated.

The control signal PCLKP is enabled for a period of time T2 which is longer than the time T1 during which the chip selection signal CSB is enabled. This is because the signal PCSB is delayed by inverters 141 through 144 in the chip selection buffer 107 of FIG. 5. That is, T2 is longer than T1 by a period of time determined by the delay through the eighth through eleventh inverters 141–144.

When the chip selection signal CSB is disabled, the signal PCSB is disabled, which in turn, causes the signal PCLKP to be disabled after a time delay determined by inverters 141–144. When PCLKP is disabled, the internal clock signal PCLK is disabled regardless of the output from inverter 125 in the internal clock generating unit 105 shown in FIG. 6. Therefore, pulses P1, P2, and P3, which would be generated by a conventional clock generation circuit, are suppressed in a clock generation circuit in accordance with the present invention as shown in FIG. 10.

The active command and read/write command are sequentially input into the semiconductor device 101 of FIG. 5. When the read/write command is input, the operation of the device depends upon the burst length of data read from or written to the device 101, as well as the latency when the read command is received.

When the read/write command is input and the chip selection signal CSB is enabled, the pulse P4 is generated in the same manner as pulse P0 as described above. However, when the read/write command is input and the burst length is long, the internal clock signal PCLK must continue to be generated while data is read from or written to the device. The internal clock control unit 109 of FIG. 7 utilizes the column address signal CAi to enable the internal clock signal PCLK during the reading and writing operation and to disable it thereafter. Referring to FIG. 10, after the pulse P4 is generated, the column address signal CAi causes the control signal PCLKP to remain active even after the chip selection signal CSB is disabled. Therefore, pulse P5 is generated. If the latency signal LAT is low when the column address signal CAi is disabled, the control signal PCLKP is disabled and no further pulses are generated.

However, when a read command is received, the device 101 of FIG. 5 operates according to an externally input control signal, i.e., the latency of the column address strobe signal CAS. When the CAS latency is 2, the internal clock control unit 109 of FIG. 7 utilizes the latency signal LAT to generate a pulse P6 when the latency signal LAT is enabled to logic high, thereby allowing the data to be transferred out of this synchronous DRAM semiconductor device 101. When the latency signal LAT is disabled, the control signal PCLK is disabled, thereby preventing the generation of pulses P7 and P8.

As described above, a semiconductor device in accordance with the present invention generates the internal clock signal PCLK only when it is required for operation of the device. That is, in the example of FIG. 10 only pulses P0, P4, P5 and P6 are generated. Pulses P1, P2, P3, P7 and P8 are suppressed, thereby preventing the power consumption associated with these pulses. Since the generation of unnecessary internal clock signals is prevented, the power consumption of a synchronous DRAM semiconductor device in accordance with the present invention is reduced.

It should be understood that the invention is nor limited to the illustrated embodiment and that many changes and modifications can be made within the spirit and scope of the invention by a person skilled in the art.

What is claimed is:

1. An internal clock generation circuit for a semiconductor device comprising:

a clock buffer for receiving an external clock signal and converting a voltage level of the external clock signal;

an internal clock generation unit for receiving the output of the clock buffer and generating an internal clock signal responsive to a control signal;

a chip selection buffer for receiving a chip selection signal, activating the semiconductor device responsive to the chip selection signal, and converting a voltage level of the chip selection signal, wherein the chip selection signal is a signal for enabling and disabling the device; and an internal clock control unit for receiving the output of the chip selection buffer and generating the control signal, wherein the internal clock signal is disabled when the control signal is disabled, and the internal clock signal is enabled when the control signal is enabled and at the same time the external clock signal is enabled.

2. The internal clock generation circuit of claim 1, wherein the clock buffer converts the external clock signal from a TTL level to a CMOS level.

3. The internal clock generation circuit of claim 2, wherein the clock buffer comprises:

a differential amplifier for generating an output signal responsive to the external clock signal and a reference voltage; and an inverter for inverting the output signal of the differential amplifier.

4. The internal clock generation circuit of claim 1, wherein the chip selection buffer converts the chip selection signal from a TTL level to a CMOS level.

5. The internal clock generation circuit of claim 4, wherein the chip selection buffer comprises:

a differential amplifier for generating a second output signal responsive to the chip selection signal and a reference voltage; and an inverter for inverting the second output signal.

6. An internal clock generation circuit for a semiconductor device comprising:

a clock buffer for receiving an external clock signal and converting a voltage level of the external clock signal;

an internal clock generation unit for receiving the output of the clock buffer and generating an internal clock signal responsive to a control signal;

a chip selection buffer for receiving a chip selection signal, activating the semiconductor device responsive to the chip selection signal, and converting a voltage level of the chip selection signal; and an internal clock control unit for receiving the output of the chip selection buffer and generating the control signal;

wherein the internal clock signal is disabled when the control signal is disabled, and the internal clock signal is enabled when the control signal is enabled and at the same time the external clock signal is enabled; and wherein the internal clock generation unit comprises:
a plurality of inverters connected in series with the output of the clock buffer for delaying and inverting the output of the clock buffer;
a first logic gate for generating an output signal responsive to the output of the last one of the inverters and the output of the clock buffer; and
a second logic gate for receiving the output of the first logic gate and the control signal, and generating the internal clock signal only when the control signal is enabled.

7. The internal clock generation circuit of claim 6, wherein the first logic gate comprises:
a first NAND gate for receiving the output of the last one of the inverters and the output of the clock buffer; and
an inverter for receiving the output of the first NAND gate.

8. The internal clock generation circuit of claim 6, wherein the second logic gate comprises:
a NAND gate for receiving the output of the first logic gate and the control signal; and
an inverter for receiving the output of the NAND gate.

9. An internal clock generation circuit for a semiconductor device comprising:
a clock buffer for receiving an external clock signal and converting a voltage level of the external clock signal;
an internal clock generation unit for receiving the output of the clock buffer and generating an internal clock signal responsive to a control signal;
a chip selection buffer for receiving a chip selection signal, activating the semiconductor device responsive to the chip selection signal, and converting a voltage level of the chip selection signal; and
an internal clock control unit for receiving the output of the chip selection buffer and generating the control signal;
wherein the internal clock signal is disabled when the control signal is disabled, and the internal clock signal is enabled when the control signal is enabled and at the same time the external clock signal is enabled; and
wherein the internal clock control unit comprises:
a plurality of inverters connected in series with the output of the chip selection buffer for delaying the output of the chip selection buffer; and
a third logic gate for receiving the output of the last one of the inverters and the output of the chip selection buffer, and generating the control signal.

10. The internal clock generation circuit of claim 9, wherein the third logic gate is a NAND gate.

11. The internal clock generation circuit of claim 9, wherein the internal clock control unit further comprises a fourth logic gate having an input for receiving a burst signal indicating a burst length of written data and a latency signal indicating a latency of read data, and wherein the output of the internal clock control unit is disabled when either the burst signal or the latency signal is enabled.

12. The internal clock generation circuit of claim 11, wherein the fourth logic gate is a NOR gate.

13. A method for generating an internal clock for a semiconductor device to which an external clock signal, a chip selection signal and a command are applied, wherein the chip selection signal is a signal for enabling and disabling the device, the method comprising the steps of:
a) inputting the command and enabling the chip selection signal;
b) enabling the external clock signal;
c) generating a control signal which is enabled when the chip selection signal is enabled;
d) generating an internal clock signal which is enabled when the control signal is enabled and at the same time the external clock signal is enabled,
wherein the internal clock signal is not generated when the control signal is disabled.

14. The method of claim 13, wherein said step c) comprises the steps of:
generating a second control signal which is enabled when the chip selection signal is enabled; and
generating the control signal which is enabled when the second control signal is enabled.

15. A method for generating an internal clock for a semiconductor device to which an external clock signal, a chip selection signal and a command are applied, the method comprising the steps of:
a) inputting the command and enabling the chip selection signal;
b) enabling the external clock signal;
c) generating a control signal which is enabled when the chip selection signal is enabled;
d) generating an internal clock signal which is enabled when the control signal is enabled and at the same time the external clock signal is enabled,
wherein the internal clock signal is not generated when the control signal is disabled
wherein the command is for reading/writing data, and wherein said step c) further comprises the steps of:
enabling a column address signal; and
enabling a latency signal, and wherein the control signal is enabled when the column address signal and the latency signal are enabled, and the control signal is disabled when the latency signal, the control signal and the column address signal are disabled.

16. An internal clock generation circuit for a semiconductor device comprising:
an internal clock generation unit for generating an internal clock signal responsive to an external clock signal and a control signal, wherein the internal clock generation unit only generates the internal clock signal when the control signal is enabled; and
an internal clock control unit coupled to the internal clock generation unit for generating the control signal responsive to a chip selection signal for enabling and disabling the device.

17. The internal clock generation circuit of claim 16 wherein the internal clock control unit generates the control signal responsive to the chip selection signal and a column address signal.

18. The internal clock generation circuit of claim 16 wherein the internal clock control unit generates the control signal responsive to the chip selection signal and a latency signal.

19. An internal clock generation circuit for a semiconductor device comprising:
an internal clock generation unit for generating an internal clock signal responsive to an external clock signal and a control signal, wherein the internal clock generation unit only generates the internal clock signal when the control signal is enabled; and an internal clock control unit coupled to the internal clock generation unit for generating the control signal responsive to a chip selection signal;

wherein the internal clock control unit:
enables the control signal when the chip selection signal is enabled;
delays a period of time after the chip selection signal is disabled; and
disables the control signal after delaying the period of time.

20. The internal clock generation circuit of claim 16 wherein the internal clock control unit enables the control signal when either the chip selection signal, a column address signal, or a latency signal is enabled.

21. A method for generating an internal clock signal in a semiconductor device, the method comprising generating pulses in the internal clock signal only when necessary for operation of the device;

wherein generating pulses in the internal clock signal only when necessary for operation of the device includes generating pulses in the internal clock signal responsive to a chip selection signal; and wherein generating pulses in the internal clock signal only when necessary for operation of the device includes generating pulses in the internal clock signal only when a chip selection signal, a column address signal, or a latency signal is enabled.

* * * * *

UNITED STATES PATENT AND TRADEMARK OFFICE
CERTIFICATE OF CORRECTION

PATENT NO.     : 6,154,415
DATED          : November 28, 2000
INVENTOR(S)    : Jeong It is certified that error appears in the above-identified patent and that said Letters Patent is hereby corrected as shown below:

Title page,
Item [54], Title, "INTERNAL CLOCK GENERATION CIRCUIT OF SEMICONDUCTOR DEVICE AND METHOD FOR GENERATING INTERNAL CLOCK" should read -- METHOD AND APPARATUS FOR GENERATING INTERNAL CLOCK SIGNAL FOR SEMICONDUCTOR DEVICE --.

Signed and Sealed this

Twelfth Day of November, 2002

Attest:

Attesting Officer

JAMES E. ROGAN
Director of the United States Patent and Trademark Office